US009508691B1

(12) United States Patent
Delacruz et al.

(10) Patent No.: US 9,508,691 B1
(45) Date of Patent: Nov. 29, 2016

(54) FLIPPED DIE STACKS WITH MULTIPLE ROWS OF LEADFRAME INTERCONNECTS

(71) Applicant: Invensas Corporation, San Jose, CA (US)

(72) Inventors: Javier A. Delacruz, Santa Clara, CA (US); Belgacem Haba, Saratoga, CA (US); Tu Tam Vu, San Jose, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/971,384

(22) Filed: Dec. 16, 2015

(51) Int. Cl.
*H01L 25/065* (2006.01)
*H01L 23/495* (2006.01)
*H01L 23/31* (2006.01)
*H01L 23/00* (2006.01)
*H01L 23/498* (2006.01)

(52) U.S. Cl.
CPC ....... *H01L 25/0657* (2013.01); *H01L 23/3107* (2013.01); *H01L 23/49575* (2013.01); *H01L 24/45* (2013.01); *H01L 24/97* (2013.01); *H01L 23/49541* (2013.01); *H01L 23/49838* (2013.01); *H01L 2225/0651* (2013.01); *H01L 2225/06555* (2013.01)

(58) Field of Classification Search
CPC ............. H01L 23/49575; H01L 24/45; H01L 23/3107; H01L 24/97; H01L 21/56; H01L 23/49838; H01L 23/495541
See application file for complete search history.

(56) References Cited

U.S. PATENT DOCUMENTS 3,639,888 A 2/1972 Pittman et al.
4,323,914 A 4/1982 Berndlmaier et al.
4,336,551 A 6/1982 Fujita et al.
4,363,076 A 12/1982 McIver
4,500,905 A 2/1985 Shibata
4,706,166 A 11/1987 Go
4,726,777 A 2/1988 Billman et al.
(Continued)

FOREIGN PATENT DOCUMENTS

CN 2512114 Y 9/2002
CN 1531069 A 9/2004
(Continued)

OTHER PUBLICATIONS

U.S. Appl. No. 14/883,864, filed Oct. 15, 2015.
(Continued)

*Primary Examiner* — Alonzo Chambliss
(74) *Attorney, Agent, or Firm* — Lerner, David, Littenberg, Krumholz & Mentlik, LLP

(57) ABSTRACT

Stacked microelectronic packages comprise microelectronic elements each having a contact-bearing front surface and edge surfaces extending away therefrom, and a dielectric encapsulation region contacting an edge surface. The encapsulation defines first and second major surfaces of the package and a remote surface between the major surfaces. Package contacts at the remote surface include a first set of contacts at positions closer to the first major surface than a second set of contacts, which instead are at positions closer to the second major surface. The packages are configured such that major surfaces of each package can be oriented in a nonparallel direction with the major surface of a substrate, the package contacts electrically coupled to corresponding contacts at the substrate surface. The package stacking and orientation can provide increased packing density.

22 Claims, 9 Drawing Sheets

(56) References Cited

U.S. PATENT DOCUMENTS

| | | | |
|---|---|---|---|
| 4,784,972 A | 11/1988 | Hatada | |
| 4,951,122 A | 8/1990 | Tsubosaki et al. | |
| 4,967,262 A | 10/1990 | Farnsworth | |
| 5,047,837 A | 9/1991 | Kitano et al. | |
| 5,107,325 A | 4/1992 | Nakayoshi | |
| 5,138,438 A | 8/1992 | Masayuki et al. | |
| 5,200,362 A | 4/1993 | Lin et al. | |
| 5,218,234 A | 6/1993 | Thompson et al. | |
| 5,304,737 A | 4/1994 | Kim | |
| 5,311,401 A | 5/1994 | Gates, Jr. et al. | |
| 5,331,591 A | 7/1994 | Clifton | |
| 5,334,872 A | 8/1994 | Ueda et al. | |
| 5,347,428 A | 9/1994 | Carson et al. | |
| 5,365,106 A | 11/1994 | Watanabe | |
| 5,434,745 A | 7/1995 | Shokrgozar et al. | |
| 5,466,634 A | 11/1995 | Beilstein, Jr. et al. | |
| 5,534,729 A | 7/1996 | Russell | |
| 5,538,758 A | 7/1996 | Beach et al. | |
| 5,571,754 A | 11/1996 | Bertin et al. | |
| 5,592,019 A | 1/1997 | Ueda et al. | |
| 5,616,953 A | 4/1997 | King et al. | |
| 5,629,566 A | 5/1997 | Doi et al. | |
| 5,675,180 A | 10/1997 | Pedersen et al. | |
| 5,691,248 A | 11/1997 | Cronin et al. | |
| 5,698,895 A | 12/1997 | Pedersen et al. | |
| 5,716,759 A | 2/1998 | Badehi | |
| 5,721,151 A | 2/1998 | Padmanabhan et al. | |
| 5,731,631 A | 3/1998 | Yama et al. | |
| 5,737,191 A | 4/1998 | Horiuchi et al. | |
| 5,870,351 A | 2/1999 | Ladabaum et al. | |
| 5,879,965 A | 3/1999 | Jiang et al. | |
| 5,891,761 A | 4/1999 | Vindasius et al. | |
| 5,910,687 A | 6/1999 | Chen et al. | |
| 5,946,545 A | 8/1999 | Bertin et al. | |
| 5,965,947 A | 10/1999 | Nam et al. | |
| 6,030,854 A | 2/2000 | Mashimoto et al. | |
| 6,034,438 A | 3/2000 | Petersen | |
| 6,071,139 A | 6/2000 | Corisis et al. | |
| 6,087,716 A | 7/2000 | Ikeda | |
| 6,107,164 A | 8/2000 | Ohuchi | |
| 6,175,158 B1 | 1/2001 | Degani et al. | |
| 6,225,689 B1 | 5/2001 | Moden et al. | |
| 6,228,686 B1 | 5/2001 | Smith et al. | |
| 6,255,726 B1 | 7/2001 | Vindasius et al. | |
| 6,262,476 B1 | 7/2001 | Vidal | |
| 6,271,598 B1 | 8/2001 | Vindasius et al. | |
| 6,297,657 B1 | 10/2001 | Thiessen et al. | |
| 6,303,977 B1 | 10/2001 | Schroen et al. | |
| 6,315,856 B1 | 11/2001 | Asagiri et al. | |
| 6,326,244 B1 | 12/2001 | Brooks et al. | |
| 6,326,689 B1 | 12/2001 | Thomas | |
| 6,338,980 B1 | 1/2002 | Satoh | |
| 6,351,030 B2 | 2/2002 | Havens et al. | |
| 6,472,746 B2 | 10/2002 | Taniguchi et al. | |
| 6,476,467 B2 | 11/2002 | Nakamura et al. | |
| 6,566,760 B1 * | 5/2003 | Kawamura | G11C 5/02 257/686 |
| 6,569,709 B2 | 5/2003 | Derderian | |
| D475,981 S | 6/2003 | Michii | |
| 6,580,165 B1 | 6/2003 | Singh | |
| 6,582,992 B2 | 6/2003 | Poo et al. | |
| 6,593,648 B2 | 7/2003 | Emoto | |
| 6,607,938 B2 | 8/2003 | Kwon et al. | |
| 6,607,941 B2 | 8/2003 | Prabhu et al. | |
| 6,621,155 B1 | 9/2003 | Perino et al. | |
| 6,621,172 B2 | 9/2003 | Nakayama et al. | |
| 6,624,505 B2 | 9/2003 | Badehi | |
| 6,656,827 B1 | 12/2003 | Tsao et al. | |
| 6,667,543 B1 | 12/2003 | Chow et al. | |
| 6,670,701 B2 | 12/2003 | Matsuura et al. | |
| 6,674,159 B1 | 1/2004 | Peterson et al. | |
| 6,686,655 B2 | 2/2004 | Moden et al. | |
| 6,706,971 B2 | 3/2004 | Albert et al. | |
| 6,710,246 B1 * | 3/2004 | Mostafazadeh | H01L 21/561 174/528 |
| 6,717,061 B2 | 4/2004 | Yamaguchi et al. | |
| 6,722,213 B2 | 4/2004 | Offen et al. | |
| 6,730,997 B2 | 5/2004 | Beyne et al. | |
| 6,737,743 B2 | 5/2004 | Urakawa | |
| 6,747,348 B2 | 6/2004 | Jeung et al. | |
| 6,750,547 B2 | 6/2004 | Jeung et al. | |
| 6,756,252 B2 | 6/2004 | Nakanishi | |
| 6,777,767 B2 | 8/2004 | Badehi | |
| 6,802,446 B2 | 10/2004 | Chaudhuri et al. | |
| 6,844,623 B1 | 1/2005 | Peterson et al. | |
| 6,849,802 B2 | 2/2005 | Song et al. | |
| 6,908,784 B1 | 6/2005 | Farnworth et al. | |
| 6,910,268 B2 | 6/2005 | Miller | |
| 6,940,022 B1 | 9/2005 | Vinciarelli et al. | |
| 6,956,283 B1 | 10/2005 | Peterson | |
| 6,964,915 B2 | 11/2005 | Farnworth et al. | |
| 6,972,480 B2 | 12/2005 | Zilber et al. | |
| 6,973,718 B2 | 12/2005 | Sheppard, Jr. et al. | |
| 6,984,885 B1 | 1/2006 | Harada et al. | |
| 7,005,324 B2 | 2/2006 | Imai | |
| 7,029,949 B2 | 4/2006 | Farnworth et al. | |
| 7,061,125 B2 | 6/2006 | Cho et al. | |
| 7,115,986 B2 | 10/2006 | Moon et al. | |
| 7,125,750 B2 | 10/2006 | Kwan et al. | |
| 7,127,807 B2 | 10/2006 | Yamaguchi et al. | |
| 7,180,168 B2 | 2/2007 | Imai | |
| 7,190,060 B1 | 3/2007 | Chiang | |
| 7,196,262 B2 | 3/2007 | Gronet | |
| 7,208,335 B2 | 4/2007 | Boon et al. | |
| 7,208,345 B2 | 4/2007 | Meyer et al. | |
| 7,215,018 B2 | 5/2007 | Vindasius et al. | |
| 7,221,051 B2 | 5/2007 | Ono et al. | |
| 7,245,021 B2 | 7/2007 | Vindasius et al. | |
| 7,259,455 B2 | 8/2007 | Seto | |
| 7,279,363 B2 | 10/2007 | Cherukuri et al. | |
| 7,285,865 B2 | 10/2007 | Kwon et al. | |
| 7,335,533 B2 | 2/2008 | Derderian | |
| 7,344,917 B2 | 3/2008 | Gautham | |
| 7,355,274 B2 | 4/2008 | Lim | |
| 7,405,138 B2 | 7/2008 | Ohuchi et al. | |
| 7,408,243 B2 | 8/2008 | Shiffer | |
| 7,429,782 B2 | 9/2008 | Brunnbauer et al. | |
| 7,452,743 B2 | 11/2008 | Oliver et al. | |
| 7,514,350 B2 | 4/2009 | Hashimoto | |
| 7,521,288 B2 | 4/2009 | Arai et al. | |
| 7,535,109 B2 | 5/2009 | Robinson et al. | |
| 7,564,142 B2 | 7/2009 | Hashimoto | |
| 7,595,222 B2 | 9/2009 | Shimoishizaka et al. | |
| 7,601,039 B2 | 10/2009 | Eldridge et al. | |
| 7,638,869 B2 | 12/2009 | Irsigler et al. | |
| 7,662,670 B2 | 2/2010 | Noma et al. | |
| 7,662,671 B2 | 2/2010 | Saeki | |
| 7,704,794 B2 | 4/2010 | Mess et al. | |
| 7,732,912 B2 | 6/2010 | Damberg | |
| 7,768,795 B2 | 8/2010 | Sakurai et al. | |
| 7,829,438 B2 | 11/2010 | Haba et al. | |
| 7,863,159 B2 | 1/2011 | Co et al. | |
| 7,888,185 B2 | 2/2011 | Corisis et al. | |
| 7,901,989 B2 | 3/2011 | Haba et al. | |
| 7,919,846 B2 | 4/2011 | Hembree | |
| 7,923,349 B2 | 4/2011 | McElrea et al. | |
| 7,951,649 B2 | 5/2011 | Val | |
| 7,952,195 B2 | 5/2011 | Haba | |
| 8,022,527 B2 | 9/2011 | Haba et al. | |
| 8,076,788 B2 | 12/2011 | Haba et al. | |
| 8,178,978 B2 | 5/2012 | McElrea et al. | |
| 8,373,280 B2 | 2/2013 | Harada et al. | |
| 8,390,109 B2 | 3/2013 | Popovic et al. | |
| 8,431,435 B2 | 4/2013 | Haba et al. | |
| 8,551,815 B2 | 10/2013 | Avsian et al. | |
| 8,618,659 B2 | 12/2013 | Sato et al. | |
| 8,619,659 B2 | 12/2013 | Lee et al. | |
| 8,629,543 B2 | 1/2014 | McElrea et al. | |
| 8,633,576 B2 | 1/2014 | Zohni et al. | |
| 8,674,482 B2 | 3/2014 | Shi et al. | |
| 8,704,379 B2 | 4/2014 | Crane et al. | |
| 8,723,332 B2 | 5/2014 | McElrea et al. | |
| 9,123,418 B2 | 9/2015 | Lin et al. | |
| 9,136,251 B2 | 9/2015 | Cheah et al. | |

(56) References Cited

U.S. PATENT DOCUMENTS

| | | |
|---|---|---|
| 2001/0012725 A1 | 8/2001 | Maeda et al. |
| 2001/0031548 A1 | 10/2001 | Elenius et al. |
| 2002/0006686 A1 | 1/2002 | Cloud et al. |
| 2002/0027257 A1 | 3/2002 | Kinsman et al. |
| 2002/0045290 A1 | 4/2002 | Ball |
| 2002/0096349 A1 | 7/2002 | Hedler et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0185725 A1 | 12/2002 | Moden et al. |
| 2002/0187260 A1 | 12/2002 | Sheppard et al. |
| 2002/0190368 A1 | 12/2002 | Shimoe et al. |
| 2003/0038353 A1 | 2/2003 | Derderian |
| 2003/0038356 A1 | 2/2003 | Derderian |
| 2003/0038357 A1 | 2/2003 | Derderian |
| 2003/0060034 A1 | 3/2003 | Beyne et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |
| 2003/0092326 A1 | 5/2003 | Nishikawa et al. |
| 2003/0096454 A1 | 5/2003 | Poo et al. |
| 2003/0099085 A1 | 5/2003 | Duva |
| 2003/0122243 A1 | 7/2003 | Lee et al. |
| 2003/0143819 A1 | 7/2003 | Hedler et al. |
| 2003/0148597 A1 | 8/2003 | Tan et al. |
| 2003/0162369 A1 | 8/2003 | Kobayashi |
| 2003/0209772 A1 | 11/2003 | Prabhu |
| 2004/0113283 A1 | 6/2004 | Farnworth et al. |
| 2004/0142509 A1 | 7/2004 | Imai |
| 2004/0150095 A1 | 8/2004 | Fraley et al. |
| 2004/0173892 A1 | 9/2004 | Nakanishi |
| 2004/0195667 A1 | 10/2004 | Karnezos |
| 2004/0198033 A1 | 10/2004 | Lee et al. |
| 2004/0212083 A1 | 10/2004 | Yang |
| 2004/0217446 A1 | 11/2004 | Headley et al. |
| 2004/0227235 A1 | 11/2004 | Hashimoto |
| 2004/0238933 A1 | 12/2004 | Chen et al. |
| 2004/0251520 A1 | 12/2004 | Sasaki et al. |
| 2004/0262035 A1 | 12/2004 | Ko et al. |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0148160 A1 | 7/2005 | Farnworth et al. |
| 2005/0156323 A1 | 7/2005 | Tokunaga |
| 2005/0230802 A1 | 10/2005 | Vindasius et al. |
| 2005/0248021 A1 | 11/2005 | Morkner |
| 2005/0258530 A1 | 11/2005 | Vindasius et al. |
| 2005/0287705 A1 | 12/2005 | Yang |
| 2005/0287709 A1 | 12/2005 | Lee et al. |
| 2006/0003552 A1 | 1/2006 | Okada |
| 2006/0035408 A1 | 2/2006 | Derderian |
| 2006/0046436 A1 | 3/2006 | Ohuchi et al. |
| 2006/0055050 A1 | 3/2006 | Numata et al. |
| 2006/0068567 A1 | 3/2006 | Beyne et al. |
| 2006/0076690 A1 | 4/2006 | Khandros et al. |
| 2006/0094165 A1 | 5/2006 | Hedler et al. |
| 2006/0097356 A1 | 5/2006 | Fujii et al. |
| 2006/0103000 A1 | 5/2006 | Kurosawa |
| 2006/0121645 A1 | 6/2006 | Ball |
| 2006/0138626 A1 | 6/2006 | Liew et al. |
| 2006/0220262 A1 | 10/2006 | Meyer et al. |
| 2006/0252180 A1 | 11/2006 | Moden et al. |
| 2006/0267173 A1 | 11/2006 | Takiar et al. |
| 2006/0273365 A1 | 12/2006 | Cross et al. |
| 2006/0278971 A1 | 12/2006 | Barnes et al. |
| 2007/0023900 A1 | 2/2007 | Toyoda |
| 2007/0029684 A1 | 2/2007 | Arai et al. |
| 2007/0065987 A1 | 3/2007 | Mess et al. |
| 2007/0102801 A1 | 5/2007 | Ishida et al. |
| 2007/0132082 A1 | 6/2007 | Tang et al. |
| 2007/0158799 A1 | 7/2007 | Chiu et al. |
| 2007/0158807 A1 | 7/2007 | Lu et al. |
| 2007/0170572 A1 | 7/2007 | Liu et al. |
| 2007/0181989 A1 | 8/2007 | Corisis et al. |
| 2007/0187811 A1 | 8/2007 | Arai et al. |
| 2007/0194462 A1 | 8/2007 | Kim et al. |
| 2007/0222054 A1 | 9/2007 | Hembree |
| 2007/0252262 A1 | 11/2007 | Robinson et al. |
| 2007/0284716 A1 | 12/2007 | Vindasius et al. |
| 2008/0029866 A1* | 2/2008 | Kim ............ H01L 23/3107 257/686 |
| 2008/0083976 A1 | 4/2008 | Haba et al. |
| 2008/0083977 A1 | 4/2008 | Haba et al. |
| 2008/0112150 A1 | 5/2008 | Jones |
| 2008/0150158 A1 | 6/2008 | Chin |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1 | 10/2008 | Inomata |
| 2008/0251939 A1 | 10/2008 | Chung et al. |
| 2008/0284044 A1 | 11/2008 | Myers |
| 2008/0290493 A1 | 11/2008 | Tsunozaki |
| 2008/0303131 A1 | 12/2008 | McElrea et al. |
| 2008/0308921 A1 | 12/2008 | Kim |
| 2008/0315407 A1 | 12/2008 | Andrews, Jr. et al. |
| 2009/0020887 A1 | 1/2009 | Mizuno et al. |
| 2009/0020889 A1 | 1/2009 | Murayama et al. |
| 2009/0045524 A1* | 2/2009 | Mohammed ............ H01L 23/13 257/777 |
| 2009/0065948 A1 | 3/2009 | Wang |
| 2009/0068790 A1 | 3/2009 | Caskey et al. |
| 2009/0102038 A1 | 4/2009 | McElrea et al. |
| 2009/0146137 A1 | 6/2009 | Kim et al. |
| 2009/0160065 A1 | 6/2009 | Haba et al. |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0140811 A1 | 6/2010 | Leal et al. |
| 2010/0148352 A1 | 6/2010 | Moden |
| 2010/0207277 A1 | 8/2010 | Bauer et al. |
| 2010/0327461 A1 | 12/2010 | Co et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0187007 A1 | 8/2011 | Haba et al. |
| 2011/0248410 A1 | 10/2011 | Avsian et al. |
| 2011/0266684 A1 | 11/2011 | Leal |
| 2012/0061846 A1 | 3/2012 | Rathburn |
| 2012/0080807 A1 | 4/2012 | Haba et al. |
| 2012/0133057 A1 | 5/2012 | Haba et al. |
| 2012/0211878 A1 | 8/2012 | Popovic et al. |
| 2013/0083583 A1* | 4/2013 | Crisp ................. H01L 23/13 365/63 |
| 2013/0099392 A1 | 4/2013 | McElrea et al. |
| 2013/0119542 A1 | 5/2013 | Oh |
| 2013/0154117 A1 | 6/2013 | Tan et al. |
| 2013/0286707 A1 | 10/2013 | Crisp et al. |
| 2014/0264945 A1* | 9/2014 | Yap ..................... H01L 24/96 257/777 |

FOREIGN PATENT DOCUMENTS

| | | |
|---|---|---|
| CN | 1638118 A | 7/2005 |
| CN | 1905148 A | 1/2007 |
| CN | 104332462 A | 2/2015 |
| DE | 102004039906 A1 | 8/2005 |
| EP | 1041624 A1 | 10/2000 |
| EP | 1763894 A2 | 3/2007 |
| EP | 2650880 A1 | 10/2013 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2003-142518 A | 5/2003 |
| JP | 2003163324 A | 6/2003 |
| JP | 2001210782 A | 8/2003 |

(56) References Cited

FOREIGN PATENT DOCUMENTS

| | | |
|---|---|---|
| JP | 2004047702 | 2/2004 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 | 12/2006 |
| JP | 2007073803 A | 3/2007 |
| JP | 2007523482 A | 8/2007 |
| JP | 2008160119 | 7/2008 |
| JP | 2008205453 A | 9/2008 |
| JP | 2008236688 A | 10/2008 |
| JP | 2009-026969 | 2/2009 |
| JP | 2009027039 A | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| KR | 20080091980 | 10/2008 |
| TW | 475244 | 2/2002 |
| TW | 200425356 A | 11/2004 |
| TW | 200504995 A | 2/2005 |
| TW | 200527549 A | 8/2005 |
| TW | 200605298 A | 2/2006 |
| TW | 200721471 | 6/2007 |
| TW | 200913208 A | 3/2009 |
| TW | 200940570 A | 10/2009 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005081315 A2 | 9/2005 |
| WO | 2005101492 A2 | 10/2005 |
| WO | 2009032371 A1 | 3/2009 |
| WO | 2009052150 A1 | 4/2009 |
| WO | 2009114670 A2 | 9/2009 |
| WO | 2010057339 A1 | 5/2010 |

OTHER PUBLICATIONS

Oheah, Bok Eng, et al., Modeling and Electrical Characteristics Evaluation of Vertical Side-Chip Internconnection for Compact 3D Integration, School of Electrical and Electronic Engineering, Universiti Sains Malaysia, 13th Electronics Materials and Packaging (EMAP), Nov. 2011.

Kong, J., et al., Sensitivity Study of Channel Termination on Vertical Side-Chip Interconnection, Universiti Sains Malaysia, 35th International Electronic Manufacturing Technology Conference, 2012.

Han, Sang Wook, Wireless Interconnect using Inductive Coupling in 3D-ICs, University of Michigan, 2012.

* cited by examiner

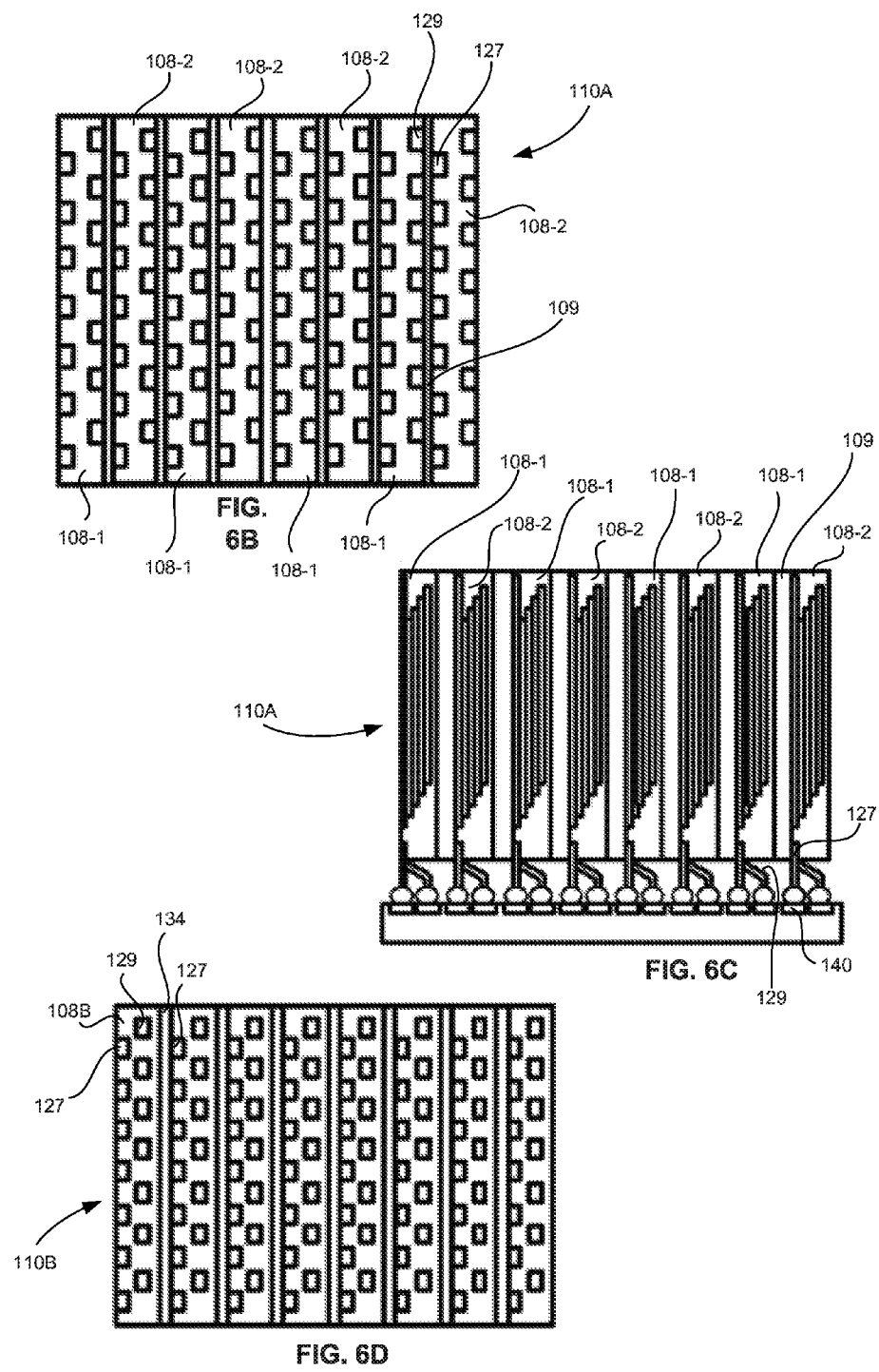

FLIPPED DIE STACKS WITH MULTIPLE ROWS OF LEADFRAME INTERCONNECTS

BACKGROUND OF THE INVENTION

Field of the Invention

The subject matter of this application relates to microelectronic packages and assemblies in which a plurality of semiconductor chips are stacked one above the other and electrically interconnected with a support element such as a package element or other circuit panel.

Description of the Related Art

Semiconductor die or chips are flat bodies with contacts disposed on the front surface that are connected to the internal electrical circuitry of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer, e.g., a server, among others.

Microelectronic packages can be fabricated which include semiconductor chips mounted on leadframes. Such packages can be incorporated in larger assemblies, typically as surface-mounted devices coupled to a circuit panel. In order to save space certain conventional designs have stacked multiple microelectronic elements or semiconductor chips within a package. This allows the package to occupy a surface area on a substrate that is less than the total surface area of the chips in the stack. However, conventional stacked packages have disadvantages of complexity, cost, thickness and testability.

In spite of the above advances, there remains a need for improved stacked packages and especially stacked chip packages which incorporate multiple chips for certain types of memory, e.g., flash memory. There is a need for such packages which are reliable, thin, testable, and that are economical to manufacture.

BRIEF SUMMARY OF THE INVENTION

In accordance with an aspect of the invention, a stacked microelectronic assembly can comprise a plurality of stacked encapsulated microelectronic packages. Each encapsulated microelectronic package may comprise a microelectronic element having a front surface which defines a plane, and a plurality of edge surfaces extending away from the plane of the front surface, the microelectronic element having a plurality of chip contacts at the front surface. Each package has a plurality of remote surfaces, and an encapsulation region contacting at least one edge surface of the microelectronic element and extending in the first direction away from the at least one edge surface to a corresponding one of the remote surfaces. The encapsulation region has a major surface substantially parallel to the plane of the microelectronic element. A plurality of electrically conductive package contacts are disposed adjacent a first plane defined by the first major surface and a plurality of second electrically conductive package contacts are disposed adjacent a second plane parallel to the first plane and displaced therefrom. The first package contacts and the second package contacts are disposed at a single one of the remote surfaces, and the chip contacts are electrically coupled with the package contacts. The plurality of microelectronic packages can be stacked one above another in the stacked assembly such that the planes of the microelectronic elements in each of the plurality of microelectronic packages are parallel with one another.

In accordance with one or more particular aspects, the first package contacts and the second package contacts of each package in the stacked assembly face and are electrically coupled with a corresponding set of substrate contacts at a major surface of a substrate external to the encapsulation regions of each package of the stacked assembly, wherein the major surface of the substrate is oriented non-parallel, e.g., perpendicular to or tilted relative to the planes of the microelectronic elements in the stacked assembly.

The packages are stacked such that the first major surface of each next higher ordered package faces the second major surface of the next lower ordered package adjacent thereto. In accordance with a particular embodiment, a plurality of pairs of first and second package contacts are aligned and electrically coupled with one another, each pair comprising a first package contact of each next higher ordered package and the second package contact of the next lower ordered package aligned and electrically coupled therewith.

In another example, the substrate contacts comprise a plurality of sets of substrate contacts, and each set comprises a plurality of the first substrate contacts joined with the first package contacts of only one of the microelectronic packages via an electrically conductive bonding material. A plurality of second substrate contacts can be joined with the second package contacts of only the one microelectronic package via an electrically conductive bonding material.

In one embodiment, each of the first package contacts and the second package contacts of each package is a portion of a first leadframe element or a portion of a second leadframe element, respectively, of a common leadframe. The second leadframe elements can have first portions interdigitated among neighboring first leadframe elements, wherein the second package contacts are remote from the first portions and remote from the first leadframe elements. The second leadframe elements of at least one of the packages may have bends between the first portions and the second package contacts. In one embodiment, the common leadframe of at least one of the packages further comprises a die attach pad, wherein the microelectronic element has a face bonded to the die attach pad.

In one embodiment, at least one of the packages includes a first microelectronic element, the face of the first microelectronic element bonded to a first surface of the die attach pad, and includes a second microelectronic element, the face of the second microelectronic element bonded to a second surface of the die attach pad opposite from the first surface.

In one embodiment, at least one package includes a plurality of first stacked microelectronic elements including the first microelectronic element, each first stacked microelectronic element overlying the first surface and electrically coupled with at least one of the first or second package contacts, and includes a plurality of second stacked microelectronic elements including the second microelectronic element, each second stacked microelectronic element overlying the second surface and electrically coupled with at least one of the first or second package contacts.

In one embodiment, the stacked microelectronic assembly may further comprise third package contacts, wherein the first package contacts, the second package contacts and the third package contacts are portions of first leadframe elements, second leadframe elements, and third leadframe elements, respectively, wherein immediately adjacent package contacts are spaced apart from one another in a direction orthogonal to the major surfaces of the package and the first package contacts are spaced farther apart in the orthogonal direction from the third package contacts than from the second package contacts.

In one embodiment, each of the microelectronic packages has an identical arrangement of the first package contacts and the second package contacts, wherein the packages comprise first packages each having a first orientation, and second packages having a second orientation opposite from the first orientation, wherein at least some of the first packages are stacked immediately adjacent with at least some of the second packages among the stacked packages.

In accordance with an aspect of the invention, an encapsulated microelectronic package can comprise a microelectronic element having a front surface defining a plane, a plurality of edge surfaces extending away from the plane of the front surface, and a plurality of chip contacts at the front surface. The package may have a plurality of remote surfaces, and an encapsulation region contacting at least one edge surface of the microelectronic element and extending away from the at least one edge surface to a corresponding one of the remote surfaces, and the encapsulation region having first and second oppositely-facing major surfaces, each major surface being at least substantially parallel to the plane of the microelectronic element. A plurality of first electrically conductive package contacts may be disposed adjacent a plane defined by the first major surface and a plurality of second electrically conductive package contacts disposed adjacent a plane defined by the second major surface, the first package contacts and the second package contacts being disposed at a single one of the remote surfaces, the chip contacts electrically coupled with the package contacts.

In one embodiment, each of the first package contacts and the second package contacts of each package is a portion of a first leadframe element or a portion of a second leadframe element, respectively, of a common leadframe, the second leadframe elements having first portions interdigitated among neighboring first leadframe elements, the second package contacts being remote from the first portions and remote from the first leadframe elements.

In one embodiment, the second leadframe elements of at least one of the packages have bends between the first portions and the second package contacts. In one embodiment, the common leadframe may further comprise a die attach pad, wherein the microelectronic element has a face bonded to the die attach pad.

In one embodiment, the microelectronic element is a first microelectronic element, the face of the first microelectronic element facing toward a first surface of the die attach pad, the package further comprising a second microelectronic element, the face of the second microelectronic element facing toward a second surface of the die attach pad opposite from the first surface.

In one embodiment, the microelectronic element may comprise first and second microelectronic elements, the faces of the first and second microelectronic elements overlying and mechanically coupled with a first surface of the die attach pad.

In one embodiment, the microelectronic element may comprise a plurality of the first microelectronic elements stacked and overlying the first surface and electrically coupled with at least one of the first package contacts or second package contacts, and comprises a plurality of the second microelectronic elements stacked and overlying the second surface and electrically coupled with at least one of the first package contacts or the second package contacts.

In one embodiment, the microelectronic package can have third package contacts, wherein the first package contacts, the second package contacts and the third package contacts are end portions of first leadframe elements, second leadframe elements, and third leadframe elements, respectively, wherein immediately adjacent end portions are spaced apart from one another in a direction orthogonal to the major surfaces of the package and the first package contacts are spaced farther apart in the orthogonal direction from the third package contacts than from the second package contacts.

In one embodiment, the plurality of first stacked microelectronic elements are stacked such that an edge surface of each first stacked microelectronic element is offset in a direction perpendicular to the edge surface from the edge surface of each first stacked microelectronic element which is immediately beneath such first stacked microelectronic element, and the plurality of first stacked microelectronic elements are electrically coupled with the first package contacts and the second package contacts via wire bonds.

In one embodiment, the first package contacts and the second package contacts do not extend more than 25 microns beyond a surface of the encapsulation region, the package further comprising a compliant material disposed between first leadframe elements and at least some of the second leadframe elements at locations proximate to said remote surface of the encapsulation.

In one embodiment, the second leadframe elements protrude beyond a surface of the encapsulation region by more than 50 microns.

BRIEF DESCRIPTION OF THE SEVERAL VIEWS OF THE DRAWINGS

FIG. 6B is a bottom elevational view of a microelectronic assembly according to a variation of the embodiment of the invention seen in FIG. 6A.

FIG. 6C is a corresponding side elevational view of the microelectronic assembly according to the variation seen in FIG. 6B.

FIG. 6D is a bottom elevational view of a microelectronic assembly according to another variation of the embodiment of the invention seen in FIG. 6A.

DETAILED DESCRIPTION OF THE INVENTION

As used in this disclosure with reference to a dielectric region or a dielectric structure of a component, e.g., circuit structure, interposer, microelectronic element, capacitor, voltage regulator, circuit panel, substrate, etc., a statement that an electrically conductive element is "at" a surface of the dielectric region or component indicates that, when the surface is not covered or assembled with any other element, the electrically conductive element is available for contact with a theoretical point moving in a direction perpendicular to that surface of the dielectric region from outside the dielectric region or component. Thus, a terminal or other conductive element which is at a surface of a dielectric region may project from such surface; may be flush with such surface; or may be recessed relative to such surface in a hole or depression in the dielectric region.

Figure 1:
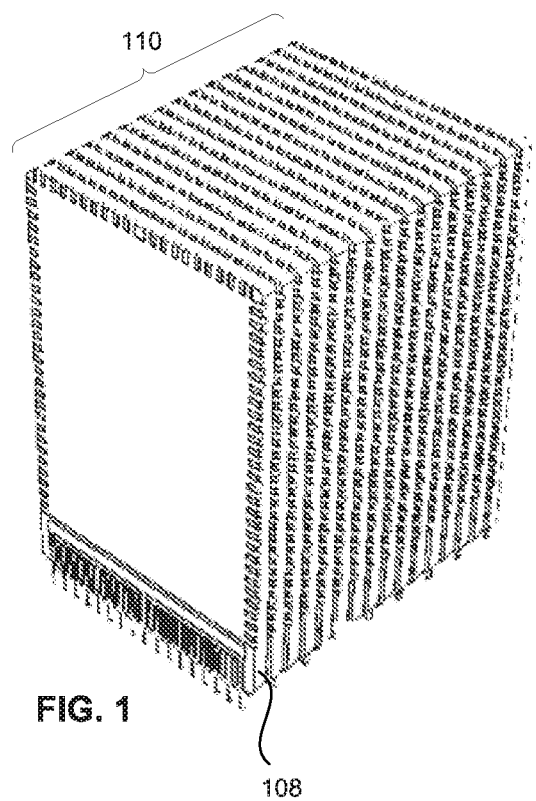
FIG. 1 is a perspective view from above top and edge surfaces of a microelectronic assembly according to an embodiment of the invention.
Figure 2:
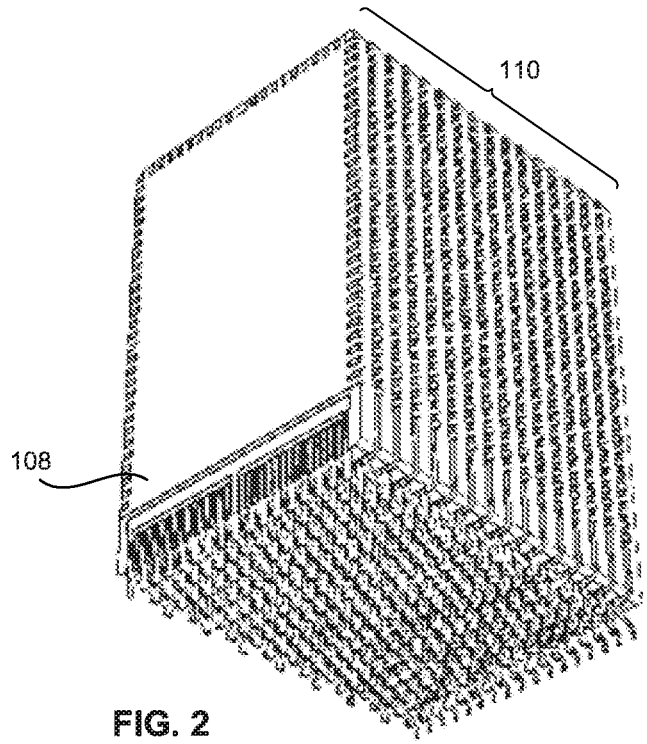
FIG. 2 is a perspective view from below the bottom and edge surfaces of a microelectronic assembly according to an embodiment of the invention.
Figure 3:
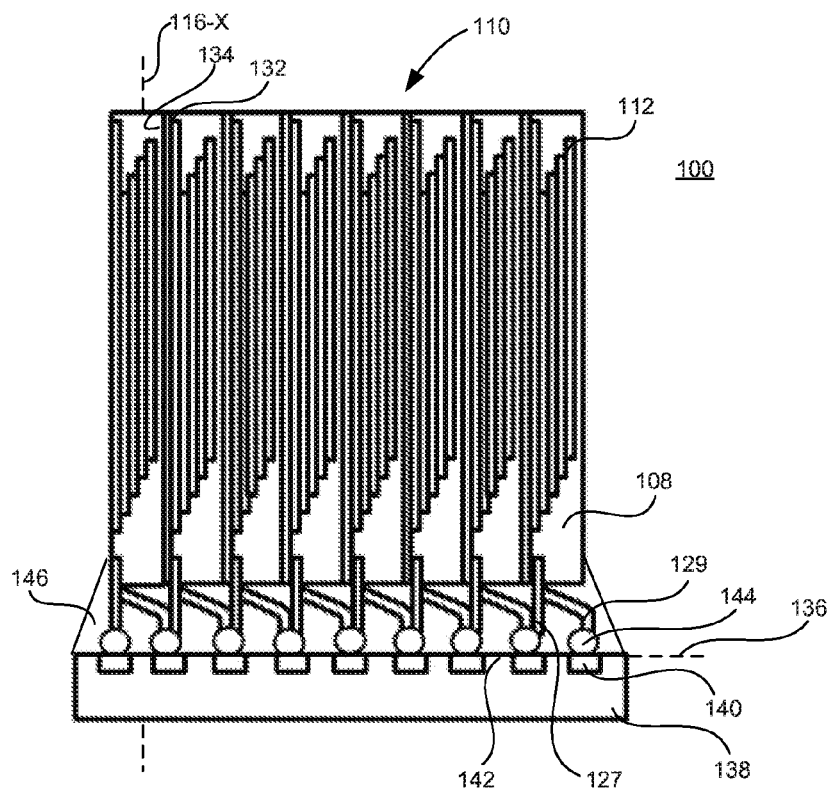
FIG. 3 is a side elevational view illustrating a microelectronic assembly according to an embodiment of the invention.

As shown in the perspective views of FIGS. 1-2 and the corresponding side elevational view of FIG. 3, a microelectronic assembly 100 includes a package stack 110 which, in turn, includes a plurality of stacked microelectronic subassemblies or microelectronic packages 108, each microelectronic package including one or more microelectronic elements 112, at least one being a semiconductor chip. Microelectronic assembly 100 and other microelectronic assemblies disclosed or referenced herein can provide enhanced storage density which can be especially advantageous in systems used in data centers, among which include enterprise systems, government systems, hosted systems, search engine systems, cloud storage, or other large-scale data centers.

Figure 4:
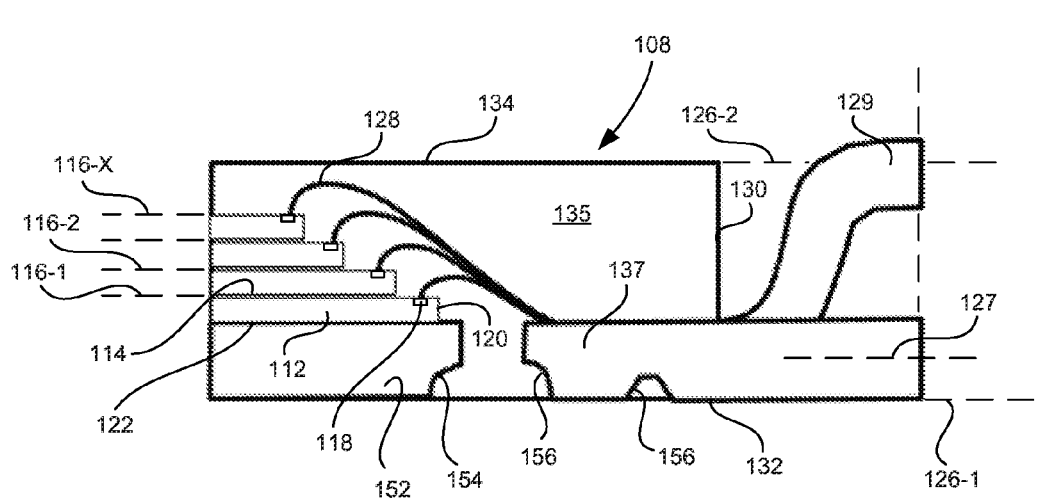
FIG. 4 is a partial enlarged side elevational view of a microelectronic package according to an embodiment of the invention.

Referring to the microelectronic package 108 according to the embodiment seen in FIG. 4, for example, each microelectronic element 112 can be arranged in a stack of similar microelectronic elements. In one example, each of the microelectronic elements may include a semiconductor chip having one or more memory storage arrays, which may include a particular memory type such as nonvolatile memory. Nonvolatile memory can be implemented in a variety of technologies some of which include memory cells that incorporate floating gates, such as, for example, flash memory, and others which include memory cells which operate based on magnetic polarities. Flash memory chips are currently in widespread use as solid state storage as an alternative to magnetic fixed disk drives for computing and mobile devices. Flash memory chips are also commonly used in portable and readily interchangeable memory drives and cards, such as Universal Serial Bus (USB) memory drives, and memory cards such as Secure Digital or SD cards, microSD cards (trademarks or registered trademarks of SD-3C), compact flash or CF card and the like. Flash memory chips typically have NAND or NOR flash type devices therein; NAND type devices are more common. Other examples of semiconductor chips are one or more DRAM, NOR, microprocessor, controller die, etc. or combinations thereof. Each semiconductor chip may be implemented in one of various semiconductor materials such as silicon, germanium, gallium arsenide or one or more other Group III-V semiconductor compounds or Group II-VI semiconductor compounds, etc. The microelectronic elements 112 in one or more microelectronic packages 108 and in one or more package stacks 110 may be a combination of different chip functionalities as described above and a combination of various semiconductor materials as described above. In one embodiment, a microelectronic element may have a greater number of active devices for providing memory storage array function than for any other function. In one embodiment, a dummy spacer made from glass, silicon, or other appropriate material can be positioned adjacent to or between microelectronic elements in a microelectronic package or subassembly.

Each microelectronic element can be a semiconductor chip having a front surface 114 defining a respective plane 116-x of a plurality of planes 116-1, 116-2, etc. Each semiconductor chip 112 has a plurality of contacts 118 at its front surface and an edge surface 120 which extends away from the front surface of such chip. Each chip also has a rear surface 122 opposite from its front surface 114. The front and rear surfaces of adjacent microelectronic elements within a package may be bonded together with an adhesive (not shown). In one embodiment, the adhesive may be or include one or more layers of epoxy, elastomer, polyimide or other polymeric material. In some cases, a material used as a conformal dielectric coating over one or more of the microelectronic elements may also function as an adhesive. In one embodiment, such conformal dielectric coating can be a polyxylylene material such as commonly referred to as "parylene". Parylene can also be used as a die attach adhesive between adjacent microelectronic elements. In one embodiment, one or more microelectronic elements may be packaged as a fan-out wafer level package.

The chip contacts 118 on one or more microelectronic elements 112 in the package 108 are electrically coupled with package contacts disposed at a periphery of the package. The package contacts of each package 108 include first package contacts 127 and second package contacts 129. A plurality of first package contacts 127 are disposed adjacent a plane 126-1 defined by a first major surface 132 of the package which is substantially parallel to the planes 116-x of the one or more microelectronic elements 112. A plurality of second package contacts 129 of the same package 108 are disposed adjacent a plane 126-2 defined by a second major surface 134 of the package which is substantially parallel to the planes 116-x of the one or more microelectronic elements 112.

In the embodiment depicted in FIG. 4, each of the package contacts 127, 129 is disposed at a single remote surface 130 of the respective package 108, and the single remote surface is defined by a vertically-oriented plane at which each package contact 127, 129 terminates, within a manufacturing tolerance. Alternatively, package contacts 127 may extend farther in a direction parallel to plane 126-1 than the package contacts 129; or the package contacts 129 may extend farther in a direction parallel to plane 126-1 than the package contacts 127. For example, the package contacts may project beyond the remote surface 130 a distance of 50 microns or more. One or both of such features may help accommodate a particular interconnection arrangement between the package and a substrate electrically coupled with the package such as described below with reference to FIGS. 8-9.

In one example, the first package contacts 127 and the second package contacts 129 are portions of individual leadframe elements severed from a single common leadframe. The first package contacts can be straight leadframe elements which extend parallel to the major surface 132 of the package. The second package contacts can be portions of other leadframe elements which are bent relative to the major surface 132 of the package such that at least one portion of the leadframe element extends in a direction at an angle to the major surface 132 of the package. In some cases, the second package contacts are terminal ends of leadframe elements 137 that have a flattened S-shape as seen in the elevational view of FIG. 4. The leadframe elements can be formed either prior to or after other fabrication processes used to electrically couple microelectronic elements in the package with the leadframe elements. The one or more microelectronic elements in each package can be supported on a die attach pad 152, a portion of the same leadframe which provides the package contacts. For example, a rear surface 122 of a lowest microelectronic element 112 in a stack thereof can be attached to an inwardly facing major surface of the leadframe die attach pad 152.

A dielectric region 135 may overlie or contact the front and edge surfaces of the package, and have a remote surface 130 spaced apart from the microelectronic element's edge surface 120 which is closest to the remote surface. In particular cases, the dielectric region can extend from two or more edge surfaces of the microelectronic element to corresponding remote surfaces of the package spaced apart from the edge surfaces. Each microelectronic element may have such dielectric region overlying the edge surface thereof. In an example, the dielectric region 135 may be or may include a molded dielectric region. In one example, the dielectric region may comprise a polymeric dielectric material, or alternatively a polymeric dielectric material with a filler therein which may have a lower coefficient of thermal expansion than the polymeric material. In some examples, the filler may include particles, flakes or a mesh or scaffold of an inorganic material such as a glass, quartz, ceramic or semiconductor material, among others.

FIG. 4 further illustrates locking features 154, 156 which can be etched out portions of the die attach pad 152 and the leadframe elements 137, such features serving to avoid forces acting on the die attach pad 152 and the leadframe elements 137 from outside the package from loosening, pulling or ripping the leadframe elements 137 out from the encapsulation region.

Figure 5:
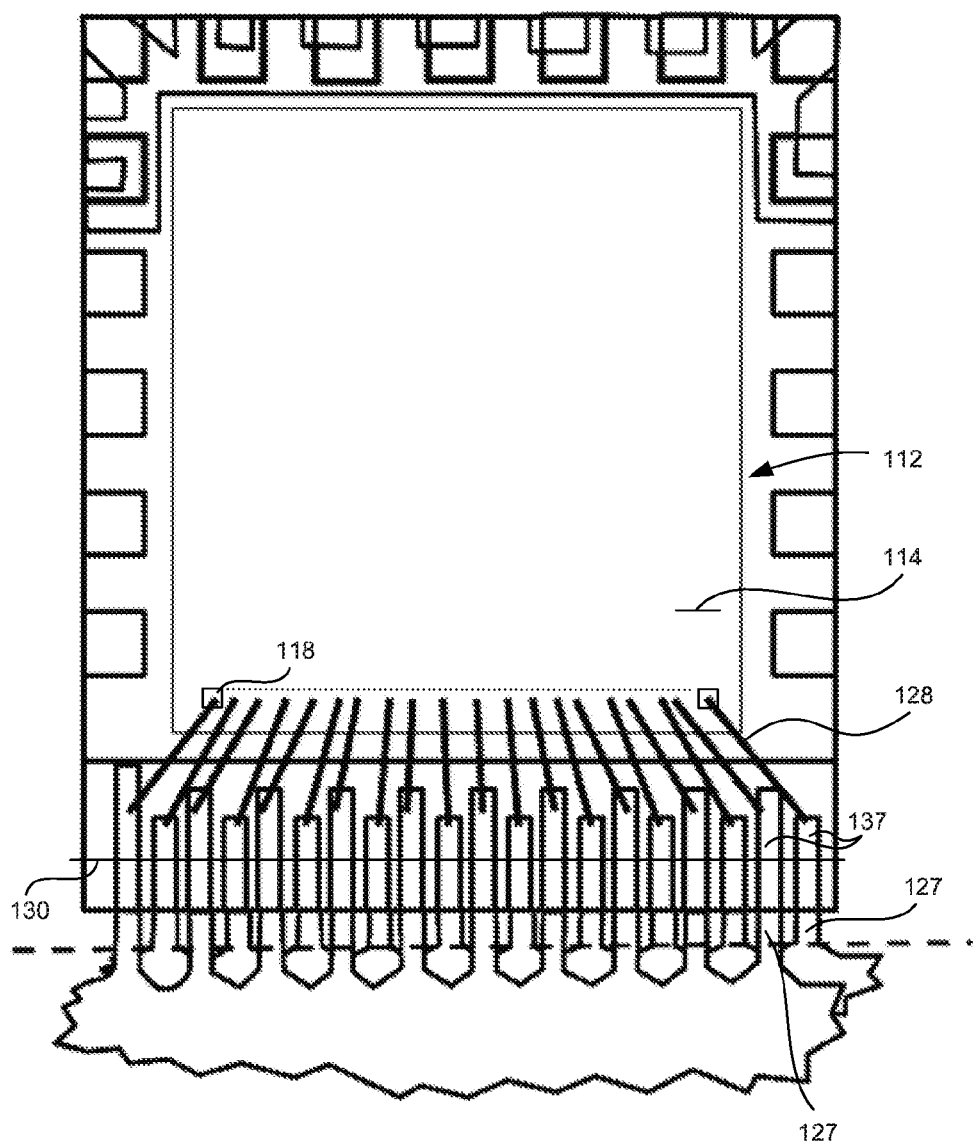
FIG. 5 is a top-down plan view of an in-process structure according to an embodiment of the invention.

All first package contacts and second package contacts of the same package can be at the same remote surface 130 of the dielectric region 135. The package contacts can be portions of leadframe elements 137 which extend inwardly towards positions closer to edge surfaces 120 of the microelectronic elements in the package As seen in FIGS. 4-5, each package contact can be electrically coupled with the chip contact 118 at a front surface of a microelectronic element through a wire bond 128. Wire bonds can be formed, for example, by heating an end of an extruded wire projecting from an exposed tip of a capillary bonding tool to form a molten metal ball at the tip of the wire, and bonding the ball under heat and pressure to the chip contact. Thereafter, the tip of the bonding tool then is moved to a position at the surface of a leadframe element 137 where the bonding tool stitch bonds a segment of the wire and then severs the bonded end of the wire to complete the process. In one variation, a reverse wire bonding technique can be employed in which the wire is ball bonded to the leadframe element and then stitch bonded to the chip contact of the respective microelectronic element. In some cases, reverse wire bonding may be selected to provide wire bonds having reduced loop height in comparison to wire bonds 128 having ball bonds on the microelectronic elements.

Referring to FIG. 4, more than one microelectronic element can be provided in an individual microelectronic package 108. An advantage of providing a plurality of microelectronic elements in the same package is a potential to increase a density of interconnection between the microelectronic elements and a substrate 138 having a finite interconnection area at a major surface 142 thereof. Microelectronic packages 108 which incorporate two microelectronic elements per package can be electrically interconnected with a substrate 138 at an effective pitch which is one half a pitch of interconnection among the package contacts 127, 129 provided at an interconnection interface with the substrate 138. In a particular embodiment, when microelectronic elements in a package 108 are microelectronic elements having memory storage arrays therein, corresponding chip contacts which on all of the microelectronic elements in the package may be electrically coupled with a single package contact of the package. The same can apply to most or all of the chip contacts of each microelectronic element, except for chip contacts assigned to receive signals routed uniquely to one of the microelectronic elements, such as a chip select input, for example. The same applies to microelectronic elements which provide non-volatile memory storage array function, such non-volatile memory storage array implemented by a greater number of active devices in the microelectronic element than for any other function of the microelectronic element.

The number of microelectronic elements stacked one above the other in each microelectronic package can range from a small number such as one or two to a much larger number, for example, eight, sixteen or even greater. In the example depicted in FIGS. 3-4, four microelectronic elements can be stacked within a single package and electrically coupled with the package contacts of such package. In another example (not shown) similar to that shown in FIG. 4, eight microelectronic elements can be stacked within a single package and electrically coupled with the package contacts 127, 129 of such package.

In a variation of the structure shown in FIG. 4, other ways can be provided for electrically coupling the microelectronic elements with the leadframe elements. For example, a conformal electrically conductive material can be deposited in contact with the chip contacts 118, front surfaces 114 and edge surfaces 120 of one or more microelectronic elements in the stack to form lines which extend from the chip contacts 118 to the leadframe elements 137. In one example, the electrically conductive material can be deposited by plating. In a particular example, the electrically conductive material can be an electrically conductive polymeric material or electrically conductive ink as disclosed in U.S. Pat. No. 8,178,978, the disclosure of which is incorporated herein, and the lines of electrically conductive material can be formed as disclosed therein.

As particularly shown in the in-process structure seen in FIG. 5, during fabrication of each package 108, the wire bonds 128 can be formed while the leadframe elements are integral portions of a leadframe, after which an encapsulant can be applied to the in-process structure, and the leadframe can be severed where shown at the dashed line to sever the individual leadframe elements into separate leadframe fingers having package contacts at ends thereof.

Figure 12:
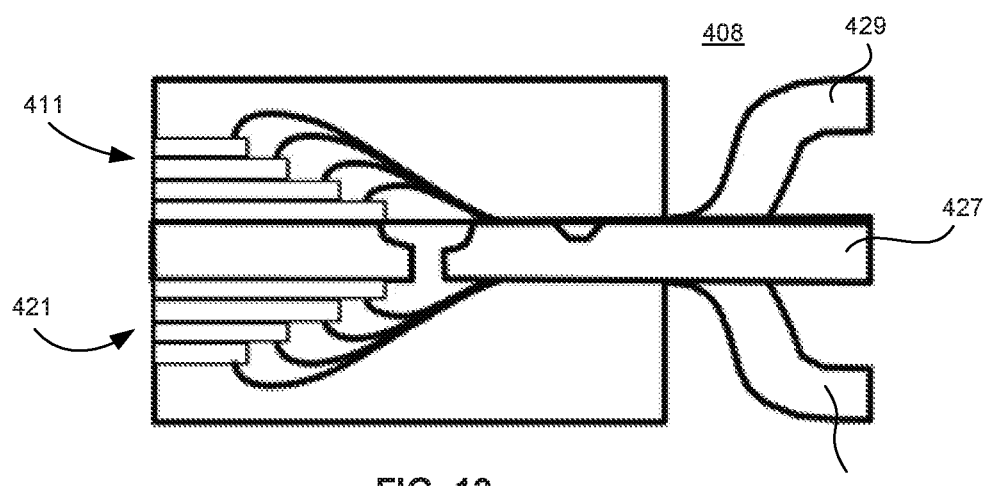
FIG. 12 is a side elevational view of a microelectronic package according to an embodiment of the invention.

Referring again to FIG. 4, all the front surfaces of each of the microelectronic elements in the package 108 are oriented in the same direction. In a variation of that shown in FIG. 4, the front surfaces of one or more of the microelectronic elements in the package can be oriented in the opposite direction. In a particular embodiment, for example, as seen in FIG. 12, the front surfaces of at least two of the microelectronic elements which are adjacent one another may either face each other or face in opposite directions away from one another.

As further shown in FIG. 3, a stacked microelectronic assembly 100 comprises a plurality of packages 108 having first package contacts 127 and second package contacts 129 electrically coupled to substrate contacts 140 at a surface 142 of a substrate 138 through electrically conductive masses 144 of bonding material. The substrate 138 may be a dielectric element or other substrate and which may have one or multiple layers of dielectric material and one or multiple electrically conductive layers thereon. The substrate 138 can be formed of various materials, which may or may not include a polymeric component, and may or may not include an inorganic component. Alternatively, the substrate may be wholly or essentially polymeric or may be wholly or essentially inorganic. In various non-limiting examples, the support element can be formed of a composite material such as glass-reinforced epoxy, e.g., FR-4, a semiconductor material, e.g., silicon or gallium arsenide, or glass or ceramic material.

The substrate can be one that has contacts on a lower surface facing away from the microelectronic assemblies, the contacts configured for surface mounting to another component which can be a card, tray, motherboard, etc., such as via a land grid array (LGA), ball grid array (BGA), or other technique. In another example, the substrate can be a card component having slide contacts on top and bottom surfaces thereof, such as for insertion into a socket. In yet another example, another component such as universal serial bus (USB) controller or other communications controller can be mounted to the substrate and electrically coupled with the microelectronic assembly, such component assisting in or controlling a flow of information between the microelectronic assembly and a system.

As illustrated in FIG. 3, the parallel planes 116-x may be oriented in a direction orthogonal to the plane 136 of the substrate major surface, and the major surface 142 of the substrate faces the edge surfaces 120 of each chip. An adhesive 146, which may be an underfill, may be applied surrounding the electrical connections between the leadframe interconnects and the substrate contacts and the adhesive may have a function to mechanically reinforce or stiffen such electrical connections and may help the electrical connections withstand stresses due to differential thermal expansion between the chips microelectronic elements 112 and the support element 138.

In a variation of the microelectronic assembly illustrated in FIGS. 1-4, a plurality of the package stacks 110 can be mounted and electrically connected to the substrate contacts 140, each package stack 110 comprising a plurality of stacked microelectronic packages, such as shown, for example in FIG. 2 of U.S. application Ser. No. 14/883,864 filed Oct. 15, 2015, the disclosure of which is incorporated herein by reference. The distance in an orthogonal direction between major surfaces of respective adjacent package stacks 108 defines a gap which, in some cases may be 100 microns, or may range from 100 to 200 microns in dimension, or may have a greater value. In some cases, this gap may be as large as 1 millimeter. Within such gap an adhesive can be provided, and/or other elements, which may in some cases include a heat spreader as further describe below, or passive components, hardware, or other components which may or may not be electrically interconnected with one or more of the package stacks 110.

Figure 6A:
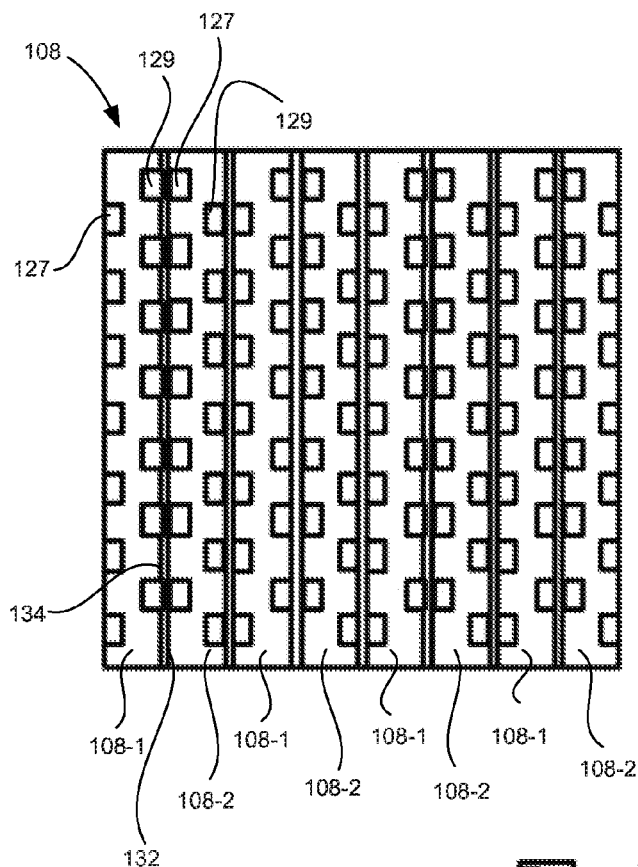
FIG. 6A is a bottom elevational view of a microelectronic assembly according to an embodiment of the invention.

As further seen in FIG. 6A, in a view of a package stack 110 looking towards bottom surfaces of packages 108 therein which are configured to be coupled with the substrate contacts, the first package contacts 127 of microelectronic packages 108 in a package stack 110 are seen adjacent a package first major surface 132 oriented in a first direction, while the second package contacts 129 of the microelectronic packages 108 are adjacent a package second major surface 134 oriented in a direction opposite the first direction. The second package contacts 127 are seen aligned and adjacent with corresponding ones of the first package contacts, wherein the aligned and adjacent first and second package contacts of the immediately adjacent packages 108 may touch or may come close to touching. Thus, the packages can be stacked such that the first major surface 132 of each next higher ordered package faces the second major surface 134 of the next lower ordered package adjacent thereto, wherein the first package contacts of each next higher ordered package are aligned with the second package contacts of the next lower ordered package adjacent thereto.

As further seen in FIG. 3, the aligned and adjacent first and second package contacts of immediately adjacent packages 108 can be electrically coupled with the same substrate contact. Specifically, the same electrically conductive mass 144 may join an individual substrate contact 140 at the substrate major surface 142 with a first package contact 127 of one package 108 and with the aligned and adjacent second package contact 127 of another package 108 immediately adjacent to such package.

In the particular arrangement of FIG. 6A, each package 108 can be identical to every other package, but some packages 108-1 have different orientations from other packages 108-2. In the example of FIG. 6A, each package 108-1 is rotated 180 degrees relative to the orientation of each package 108-2.

As seen in FIGS. 6B-6C, in a variation of the above-described embodiment, each of the packages 108-1, 108-2 in the package stack 110A can be identical to one another and have the same orientation. In this way, second package contacts 129 of one package 108-1 which are closest to the first package contacts 127 of the adjacent package 108-2 in the package stack 110A are not aligned with one another. Such arrangement can facilitate the formation of separate electrical connections between these first and second package contacts 127, 129 of adjacent packages 108-1, 108-2 to the substrate contacts 140, as seen, for example in FIG. 6C. Optionally, as seen in FIGS. 6B-C, a spacer 109 can be positioned between adjacent packages 108-1, 108-2 in the package stack to provide adequate and/or optionally uniform spacing between the first package contacts 127 and the second package contacts 129 which are closest thereto. In a particular embodiment, the leadframe elements from which the package contacts are formed can be bent or placed to maintain a relatively constant pitch of the package contacts 127, 129 even between adjacent packages.

In the package stack 110B according to the further variation seen in FIG. 6D, the second package contacts 129 can be displaced in a direction away from the second major surface 134 of each package 108B therein. In one example, the leadframe elements can be bent or placed to form the second package contacts 129 with less separation in height from the first package contacts 127 of each individual package 108B. In another example, the dielectric region 135, e.g., encapsulation of each package 108B can be formed to a greater height than in the example shown in FIG. 6A. The variation according to FIG. 6D can also facilitate the formation of separate electrical connections between first and second package contacts 127, 129 of adjacent packages 108-1, 108-2 and the substrate contacts 140, as seen, for example in FIG. 6C by providing increased separation between the first and second package contacts 127, 129 of the adjacent packages 108B seen in FIG. 6D.

Figure 7:
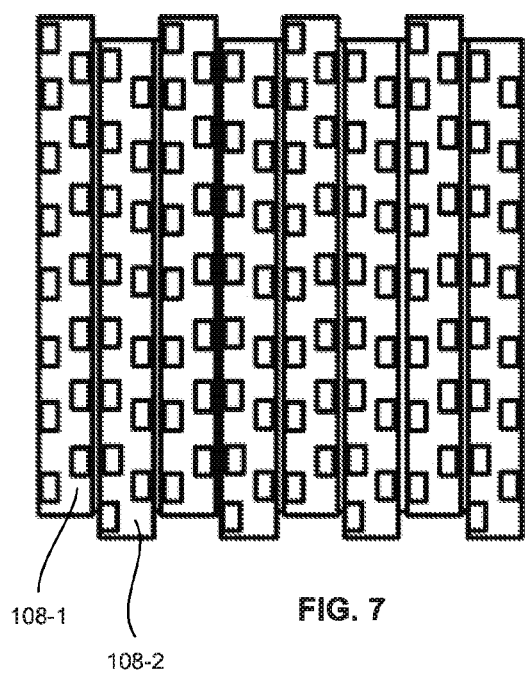
FIG. 7 is a bottom elevational view of a microelectronic assembly according to an embodiment of the invention.

In another variation seen in FIG. 7, each package has the same orientation as every other package. However, each package 108-2 is offset in a direction parallel to a major surface 132 of such package from each package 108-1. In this case, some of the first package contacts 127 on a given package may not be aligned with some of the corresponding second package contacts 129 on the package immediately adjacent thereto.

Figure 8:
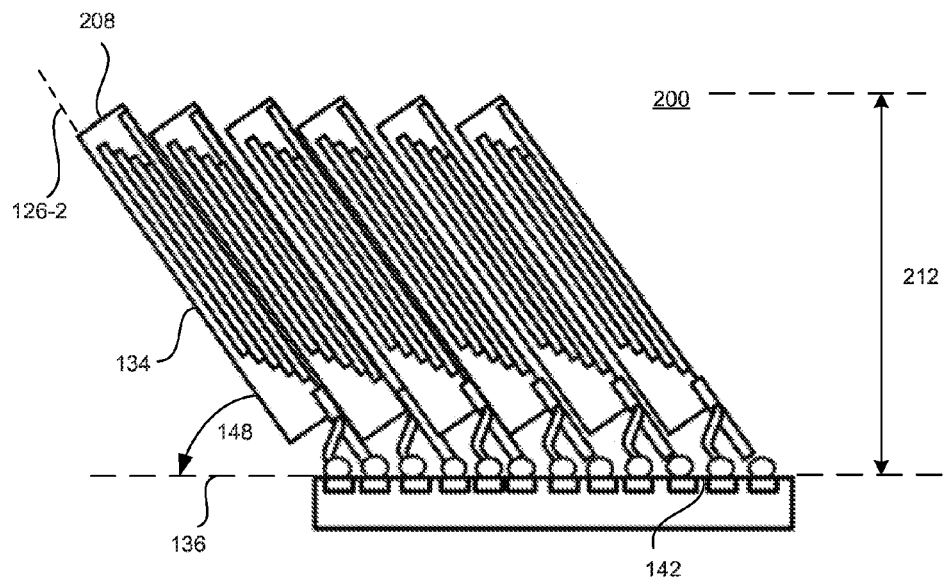
FIG. 8 is a side elevational view of a microelectronic assembly according to an embodiment of the invention.

FIG. 8 illustrates a microelectronic assembly 200 according to a particular embodiment in which the plane defined by the major surface 134 of each package 208 therein is oriented at an acute angle 148 relative to the plane 136 defined by the substrate major surface. With packages 208 tilted relative to the substrate, it is possible to accommodate a same or different number of packages as in the embodiment seen in FIGS. 1-5 above, but within a shorter height 212 from the major surface 142 of the substrate that varies with a factor based on the sine of the angle 148. In a particular example, when the angle 148 is 45 degrees, the height can be reduced by a factor based upon the sine of the angle (sin 45°). Thus, the height is reduced to less than the original height and closer to a value that equals the sine of the angle or about 0.7 the original height. In another example, if angle 148 can be reduced to 30 degrees, the height can be reduced by a factor based on the sine of the angle (sin 30°), to a value that is closer to about half the original height. Additional reinforcing material such as underfill 146 or other structure between the package stack and the substrate may be provided to reinforce the mechanical integrity of the tilted microelectronic assembly seen in FIG. 8. Although FIG. 8 indicates the front surfaces of the stacked microelectronic elements facing or tilting towards the plane 136 of the major surface of the substrate 138, tilt in the opposite direction is also possible.

Figure 9:
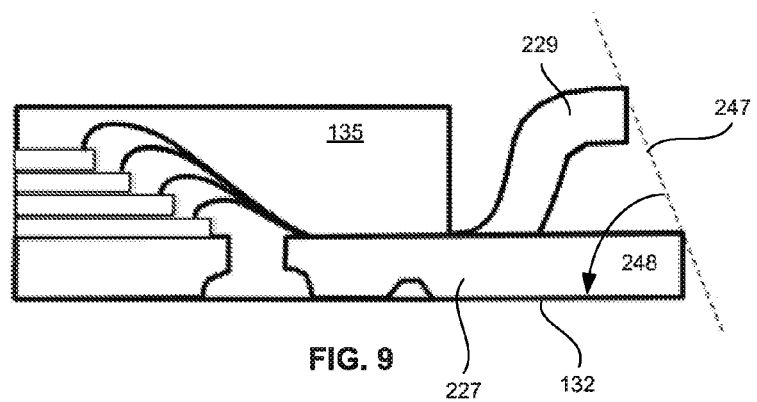
FIG. 9 is a side elevational view of a microelectronic package according to an embodiment of the invention.

Referring to FIG. 9, in a particular example of the tilted microelectronic assembly, first package contacts 227 may extend farther from the encapsulation in a direction parallel to the package major surface 134 than the second package contacts 229. In such case, the first package contacts 227 and second package contacts 229 may terminate at positions which intersect an interconnection plane 247 disposed at an acute angle 248 relative to the substrate major surface 132. In particular embodiments, the angle 248 may have the same or a different measure as the angle 148. With package contacts on one side of the package longer than those on the other side of the package, the first package contacts and the second package contacts can define a planar interconnection interface advantageous for interconnection with the substrate in the tilted microelectronic assembly seen in FIG. 8. In another embodiment, second package contacts 229 may extend farther from the encapsulation in a direction parallel to the package major surface 134 than the first package contacts 227.

Figure 10:
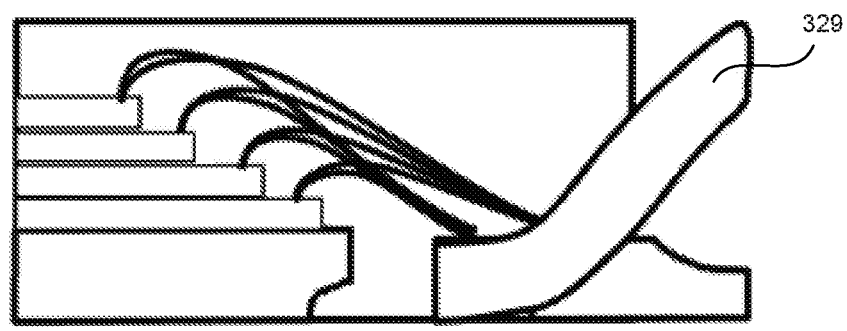
FIG. 10 is a side elevational view of a microelectronic package according to an embodiment of the invention.

FIG. 10 illustrates another variation in which leadframe elements 329 which form the second package contacts can include only a single bend, such that the leadframe element forms a flattened L-shape rather than the flattened S-shape as in the above-described example.

Figure 11:
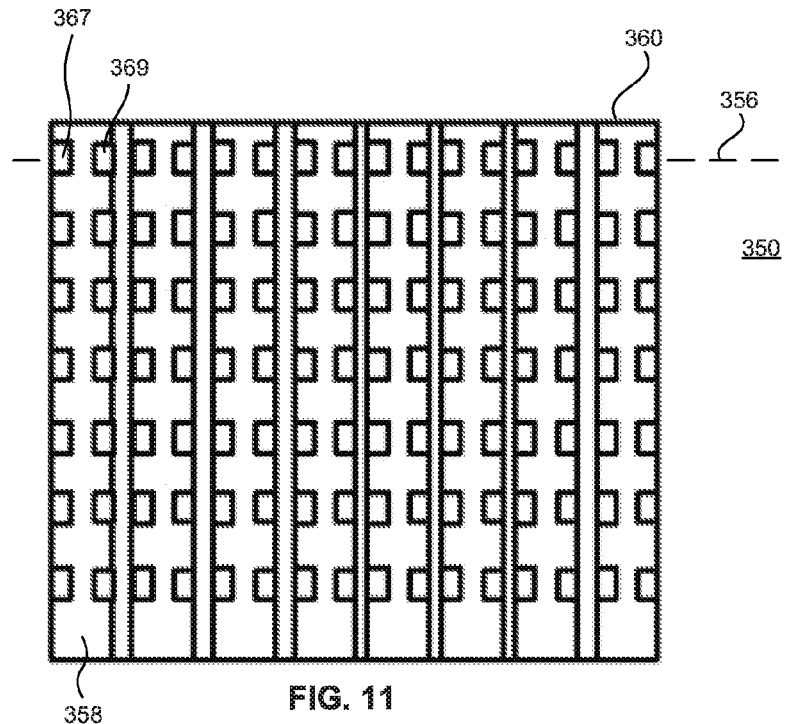
FIG. 11 is a bottom elevational view of a microelectronic assembly according to an embodiment of the invention.

FIG. 11 illustrates another variation of a microelectronic assembly 350 in which adjacent first and second package contacts 367, 369 on each package 358 therein intersect the same plane 356 parallel to an edge surface 360 of the microelectronic assembly. Package contacts 367, 369 which are adjacent one another on adjacent packages 358 may be electrically coupled to one another by bonding material 144 that electrically couples the package contacts to a corresponding substrate contact 140, as seen, for example, in FIG. 3. Alternatively, package contacts 367, 369 which are adjacent to one another on adjacent packages 358 may remain electrically separate from one another in that separate bonding material masses 144 can be used to electrically couple each of the adjacent package contacts 367, 369 to separate substrate contacts, similar to the example seen in FIG. 8 except that the packages can be oriented perpendicularly or at an angle relative to the major surface of the substrate.

Figure 13:
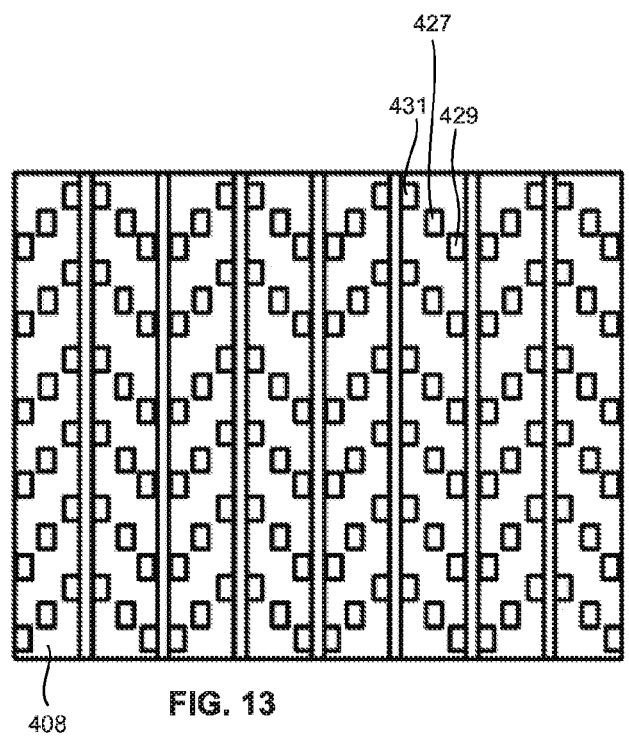
FIG. 13 is a bottom elevational view of a microelectronic assembly incorporating a plurality of packages according to an embodiment of the invention as depicted in FIG. 12.

FIG. 12 illustrates yet another variation in which first and second stacks 411, 421 of microelectronic elements can be attached to oppositely facing surfaces of leadframe die attach pad therein and microelectronic elements are electrically coupled with first package contacts 427, second package contacts 429, and third package contacts 431. In such case, first package contacts 427 can be disposed at a central position of the package 408 between the planes adjacent to which the second package contacts 429 and third package contacts 431 are disposed. In a particular example, the package contacts can be arranged at bottom-facing surfaces of the package 408 in a manner as seen in FIG. 13, such arrangement being similar to that described above relative to FIG. 6A except as to the particular arrangement including the additional third package contacts 431 and that the first package contacts are disposed centrally. In another embodiment, only first package contact 427 along with either of second package contact 429 or third package contact 431 would be formed.

Figure 14:
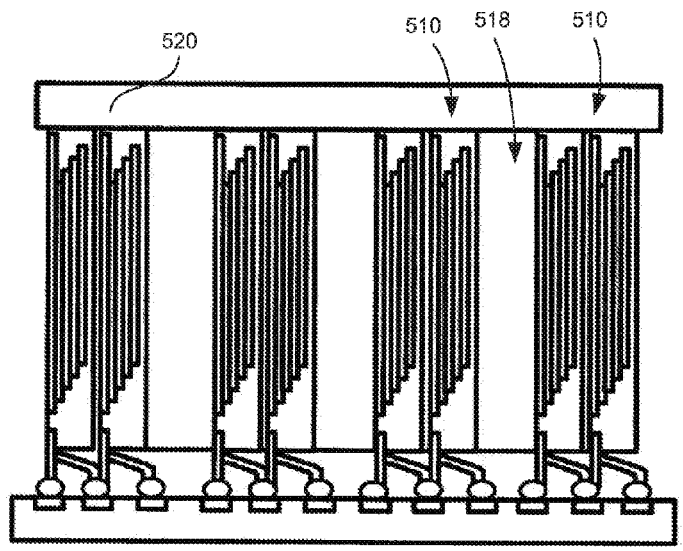
FIG. 14 is a side elevational view illustrating a microelectronic assembly according to an embodiment of the invention.

In a particular variation seen in FIG. 14, individual stacks 510 of more than one microelectronic package can be separated from one another by spaces 518 which accommodate other elements such as heat spreaders, other microelectronic packages or packaging structure, other integrated or discrete components such as resistors, capacitors, inductors or other passive or active electronic components. A further such component 520 may overlie the assembly and be electrically, mechanically and/or thermally coupled to the components within the spaces between adjacent package stacks 510.

Figure 15:
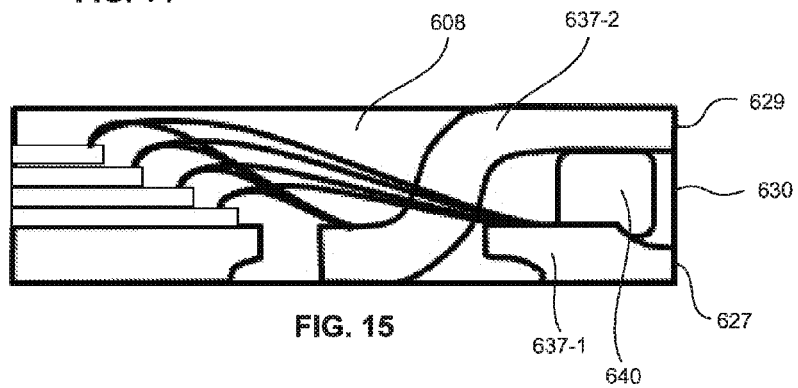
FIG. 15 is a side elevational view of a microelectronic package according to an embodiment of the invention.
Figure 16:
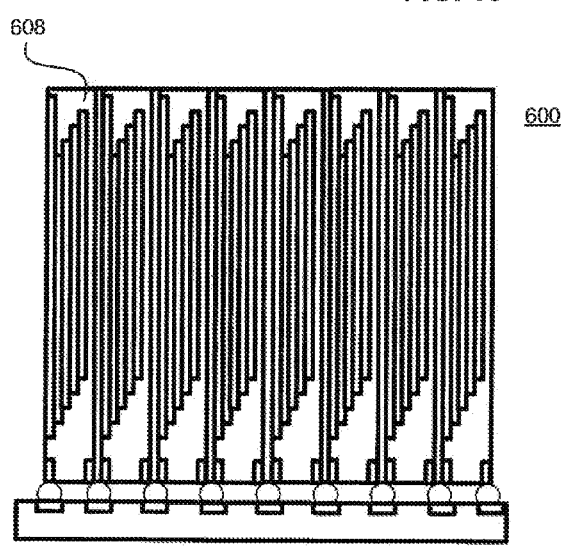
FIG. 16 is a side elevational view illustrating a microelectronic assembly according to an embodiment of the invention.

In one variation seen in FIGS. 15-16, first and second leadframe elements 637-1 and 637-2 can extend to and terminate in first package contacts 627 and second package contacts 629 which are flush with the remote surface 630 of the package within a manufacturing tolerance therefor. In such embodiment, a compliant feature 640 may be incorporated into the package to absorb stresses due to differential thermal expansion between the external substrate (e.g., substrate 138, FIG. 3) and the contacts of the package. FIG. 16 illustrates a microelectronic assembly 600 which incorporates a plurality of packages 608 in which the package contacts are so arranged. Although, FIG. 15 depicts that first package contacts 627 and second package contacts 629 are flush with the remote surface 630, they may also be recessed inside the remote surface 630.

Although not specifically shown in the Figures or particularly described in the foregoing, elements in the various Figures and various described embodiments can be combined together in additional variations of the invention.

The invention claimed is:

1. A stacked microelectronic assembly, comprising:
a plurality of stacked encapsulated microelectronic packages, each encapsulated microelectronic package comprising:
a microelectronic element having a front surface defining a plane, a plurality of edge surfaces extending away from the plane of the front surface, the microelectronic element having a plurality of chip contacts at the front surface;
each package having a plurality of remote surfaces, and an encapsulation region contacting at least one edge surface of the microelectronic element and extending away from the at least one edge surface to a corresponding one of the remote surfaces, the encapsulation region having first and second oppositely-facing major surfaces, each major surface substantially parallel to the plane of the microelectronic element; and
a plurality of first electrically conductive package contacts disposed within a first plane parallel to the first major surface and a plurality of second electrically conductive package contacts disposed within a second plane parallel to the first plane and displaced from the first package contacts, the first package contacts and the second package contacts being disposed at a single one of the remote surfaces, the chip contacts electrically coupled with the package contacts,
the plurality of microelectronic packages stacked one above another in the stacked assembly such that the planes of the microelectronic elements in each of the plurality of microelectronic packages are parallel with one another.

2. The stacked microelectronic assembly as claimed in claim 1, wherein the first package contacts and the second package contacts of each package in the stacked assembly face and are electrically coupled with corresponding substrate contacts at a major surface of a substrate external to the encapsulation regions of each package of the stacked assembly, the major surface oriented non-parallel with the planes of the microelectronic elements in the stacked assembly.

3. The stacked microelectronic assembly as claimed in claim 2, wherein the packages are stacked such that the first major surface of each next higher ordered package faces the second major surface of the next lower ordered package adjacent thereto, wherein a plurality of pairs of first and second package contacts are aligned and electrically coupled with one another, each pair comprising a first package contact of each next higher ordered package and the second package contact of the next lower ordered package aligned and electrically coupled therewith.

4. The stacked microelectronic assembly as claimed in claim 3, wherein each of the first package contacts and the second package contacts of each package is a portion of a first leadframe element or a portion of a second leadframe element, respectively, of a common leadframe, the second leadframe elements having first portions interdigitated among neighboring first leadframe elements, the second package contacts being remote from the first portions and remote from the first leadframe elements.

5. The stacked microelectronic assembly as claimed in claim 4, wherein the second leadframe elements of at least one of the packages have bends between the first portions and the second package contacts.

6. The stacked microelectronic assembly as claimed in claim 4, wherein the packages comprise first packages each having a first orientation, and second packages having a second orientation opposite from the first orientation, wherein each of the first packages and the second packages has an identical arrangement of the first package contacts and the second package contacts thereon, wherein at least some of the first packages are stacked immediately adjacent with at least some of the second packages among the stacked packages.

7. The stacked microelectronic assembly as claimed in claim 2, wherein the substrate contacts comprise a plurality of sets of substrate contacts, each set comprising a plurality of the first substrate contacts joined with the first package contacts of only one of the microelectronic packages via an electrically conductive bonding material, and a plurality of second substrate contacts joined with the second package contacts of only the one microelectronic package via an electrically conductive bonding material.

8. The stacked microelectronic assembly as claimed in claim 7, wherein the common leadframe of at least one of the packages further comprises a die attach pad, wherein the microelectronic element has a face bonded to the die attach pad.

9. The stacked microelectronic assembly as claimed in claim 8, wherein at least one of the packages includes a first microelectronic element, the face of the first microelectronic element bonded to a first surface of the die attach pad, and includes a second microelectronic element, the face of the second microelectronic element bonded to a second surface of the die attach pad opposite from the first surface.

10. The stacked microelectronic assembly as claimed in claim 9, wherein the at least one package includes a plurality of first stacked microelectronic elements including the first microelectronic element, each first stacked microelectronic element overlying the first surface and electrically coupled with at least one of the first or second package contacts, and includes a plurality of second stacked microelectronic elements including the second microelectronic element, each second stacked microelectronic element overlying the second surface and electrically coupled with at least one of the first or second package contacts.

11. The stacked microelectronic assembly as claimed in claim 1, further comprising third package contacts, wherein the first package contacts, the second package contacts and the third package contacts are portions of first leadframe elements, second leadframe elements, and third leadframe elements, respectively, wherein immediately adjacent package contacts are spaced apart from one another in a direction orthogonal to the major surfaces of the package and the first package contacts are spaced farther apart in the orthogonal direction from the third package contacts than from the second package contacts.

12. An encapsulated microelectronic package, comprising:
a microelectronic element having a front surface defining a plane, a plurality of edge surfaces extending away from the plane of the front surface, and a plurality of chip contacts at the front surface;
the package having a plurality of remote surfaces, and an encapsulation region contacting at least one edge surface of the microelectronic element and extending away from the at least one edge surface to a corresponding one of the remote surfaces, the encapsulation region having first and second oppositely-facing major surfaces, each major surface being at least substantially parallel to the plane of the microelectronic element; and a plurality of first electrically conductive package contacts disposed within a first plane parallel to the first major surface and a plurality of second electrically conductive package contacts disposed within a second plane parallel to the second and displaced from the first package contacts major surface, the first package contacts and the second package contacts being disposed at a single one of the remote surfaces, the chip contacts electrically coupled with the package contacts.

13. The microelectronic package as claimed in claim 12, wherein each of the first package contacts and the second package contacts of each package is a portion of a first leadframe element or a portion of a second leadframe element, respectively, of a common leadframe, the second leadframe elements having first portions interdigitated among neighboring first leadframe elements, the second package contacts being remote from the first portions and remote from the first leadframe elements.

14. The microelectronic package as claimed in claim 13, wherein the second leadframe elements of at least one of the packages have bends between the first portions and the second package contacts.

15. The microelectronic package as claimed in claim 13, wherein the common leadframe further comprises a die attach pad, wherein the microelectronic element has a face bonded to the die attach pad.

16. The microelectronic package as claimed in claim 15, wherein the microelectronic element is a first microelectronic element, the face of the first microelectronic element facing toward a first surface of the die attach pad, the package further comprising a second microelectronic element, the face of the second microelectronic element facing toward a second surface of the die attach pad opposite from the first surface.

17. The microelectronic package as claimed in claim 16, wherein the microelectronic element comprises a plurality of the first microelectronic elements stacked and overlying the first surface and electrically coupled with at least one of the first package contacts or second package contacts, and comprises a plurality of the second microelectronic elements stacked and overlying the second surface and electrically coupled with at least one of the first package contacts or the second package contacts.

18. The microelectronic package as claimed in claim 17, wherein the plurality of first stacked microelectronic elements are stacked such that an edge surface of each first stacked microelectronic element is offset in a direction perpendicular to the edge surface from the edge surface of each first stacked microelectronic element which is immediately beneath such first stacked microelectronic element, and the plurality of first stacked microelectronic elements are electrically coupled with the first package contacts and the second package contacts via wire bonds.

19. The microelectronic package as claimed in claim 15, wherein the microelectronic element comprises first and second microelectronic elements, the faces of the first and second microelectronic elements overlying and mechanically coupled with a first surface of the die attach pad.

20. The microelectronic package as claimed in claim 13, further comprising third package contacts, wherein the first package contacts, the second package contacts and the third package contacts are end portions of first leadframe elements, second leadframe elements, and third leadframe elements, respectively, wherein immediately adjacent end portions are spaced apart from one another in a direction orthogonal to the major surfaces of the package and the first package contacts are spaced farther apart in the orthogonal direction from the third package contacts than from the second package contacts.

21. The microelectronic package as claimed in claim 13, wherein the first package contacts and the second package contacts do not extend more than 25 microns beyond a surface of the encapsulation region, the package further comprising a compliant material disposed between first leadframe elements and at least some of the second leadframe elements at locations proximate to said remote surface of the encapsulation.

22. The microelectronic package as claimed in claim 13, wherein the second leadframe elements protrude beyond a surface of the encapsulation region by more than 50 microns.

* * * * *